(12) United States Patent
Deev et al.

(10) Patent No.: US 11,357,136 B2
(45) Date of Patent: Jun. 7, 2022

(54) DEVICE FOR COOLING SERVER RACK

(71) Applicant: YANDEX EUROPE AG, Lucerne (CH)

(72) Inventors: Mikhail Mikhailovich Deev, Moscow (RU); Petr Leonidovich Ronzhin, Balashikha (RU)

(73) Assignee: YANDEX EUROPE AG, Lucerne (CH)

( * ) Notice: Subject to any disclaimer, the term of this patent is extended or adjusted under 35 U.S.C. 154(b) by 166 days.

(21) Appl. No.: 16/905,378

(22) Filed: Jun. 18, 2020

(65) Prior Publication Data
US 2021/0161032 A1   May 27, 2021

(30) Foreign Application Priority Data
Nov. 21, 2019   (RU) .............................. RU2019137518

(51) Int. Cl.
*H05K 7/20* (2006.01)

(52) U.S. Cl.
CPC ..... *H05K 7/20818* (2013.01); *H05K 7/20309* (2013.01); *H05K 7/20318* (2013.01); *H05K 7/20327* (2013.01); *H05K 7/20736* (2013.01)

(58) Field of Classification Search
CPC ........... H05K 7/20818; H05K 7/20309; H05K 7/20318; H05K 7/20327; H05K 7/20736; H05K 7/20836
USPC .................................................... 361/679.46
See application file for complete search history.

(56) References Cited

U.S. PATENT DOCUMENTS

| | | | |
|---|---|---|---|
| 7,315,448 B1 * | 1/2008 | Bash .................... | H05K 7/2079 165/80.3 |
| 7,885,070 B2 * | 2/2011 | Campbell .......... | H05K 7/20809 361/698 |
| 8,179,677 B2 * | 5/2012 | Campbell .............. | H05K 7/203 174/15.1 |

(Continued)

FOREIGN PATENT DOCUMENTS

| CN | 205227971 U | 5/2016 |
|---|---|---|
| CN | 205641216 U | 10/2016 |

(Continued)

OTHER PUBLICATIONS

TW Office Action dated Mar. 7, 2022 in respect of TW patent application 109140445.

*Primary Examiner* — Anatoly Vortman
(74) *Attorney, Agent, or Firm* — BCF LLP

(57) ABSTRACT

There is disclosed a device for cooling a server rack within a server room having a first chamber and a second chamber, the device comprising: a main chilling unit; a heat exchanging unit operatively coupled to the main chilling unit; the main chilling unit including a housing for housing: an evaporator; a first airlock device to removably secure the main chilling unit to the server rack from a side of the first chamber; a first fan configured to force air from the first chamber to the second chamber; the heat exchanging unit including a housing for housing: a condenser in fluid communication with the evaporator, the condenser being configured to transmit heat from the liquid coolant to air surrounding the condenser; a second airlock device configured to removably secure the heat exchanging unit to the second chamber; a second fan configured to blow the heated air into the second chamber.

19 Claims, 4 Drawing Sheets

(56) References Cited

U.S. PATENT DOCUMENTS

| | | | |
|---|---|---|---|
| 8,184,436 B2 * | 5/2012 | Campbell | H05K 7/203 361/701 |
| 8,351,206 B2 * | 1/2013 | Campbell | H05K 7/20809 361/691 |
| 9,180,891 B2 | 11/2015 | Van Polen | |
| 2005/0217829 A1 * | 10/2005 | Bel | F28F 3/12 165/104.33 |
| 2009/0126293 A1 * | 5/2009 | Khalili | H05K 7/2059 52/220.1 |
| 2013/0021746 A1 * | 1/2013 | Campbell | H05K 7/2079 165/104.13 |
| 2013/0098579 A1 * | 4/2013 | Campbell | F28F 9/00 29/890.03 |
| 2019/0254198 A1 * | 8/2019 | Magallanes | H05K 7/20609 |

FOREIGN PATENT DOCUMENTS

| | | | |
|---|---|---|---|
| EP | 2298051 B1 | 2/2012 | |
| EP | 2829812 A2 * | 1/2015 | F24F 11/006 |
| EP | 2706568 B1 | 9/2018 | |
| TW | I674057 B | 10/2019 | |
| TW | M618383 U | 10/2021 | |

\* cited by examiner

DEVICE FOR COOLING SERVER RACK

CROSS-REFERENCE

The present application claims priority to Russian Patent Application No. 2019137518, entitled "Device for Cooling Server Rack", filed Nov. 21, 2019, the entirety of which is incorporated herein by reference.

FIELD

The present technology generally relates to a cooling device, more particularly, to a cooling device for cooling a server rack.

BACKGROUND

In 1965, the co-founder of Intel Corp., Gordon Moore made the observation that the number of transistors in a dense integrated circuit doubles approximately every two years. Commonly known as "Moore's law", this observation has proven to be accurate for several decades (and continues to be) in the semiconductor industry. One of the technical reasons for Moore's law is the ability, by the semiconductor fabrication industry, to shorten the distance between the pathways inside the silicon chips each successive generation.

While shrinking silicon pathways create higher performing chips, tightly packing the pathways together creates other problems to be considered. One of such problems is the heat generated by the tightly packed electrons—which unless the chip is cooled down, can melt down inside its packaging and further damage the surrounding hardware.

Generally speaking, computers have fans installed for drawing in air and exhausting the heated air for cooling down the chips. Needless to say, although such fans may be enough for certain computers (such as personal computers), it is not enough to cool down the chips found in servers in a data center. Indeed, most corporate data centers have elaborate, expensive air conditioning and venting systems to prevent overheating of the chips.

There exist several approaches for cooling down servers found in a data center. A common approach is to control the amount of air to be blown into the chamber containing the servers based on the sensed temperature of the servers. Another common approach is to cool the air (using a cooling device) entering the server room.

While such approach may be useful, it also has several downsides. For example, the amount of information to be processed, as well as the need for controlling different hardware (such as the cooling device), requires a significant amount of computational power and computational resources.

European Patent No. 2298051 B1 published Mar. 23, 2011 to Semper Holdings Ltd., and titled "Rack Mounted Cooling Unit", discloses a cooling unit comprising at least one cooling coil, at least one fan for circulating air through said at least one cooling coil, and a housing containing said at least one cooling coil and fan, wherein said housing is sized to fit within an IT server rack and is arranged for attachment to said rack.

Chinese Utility Patent No. 205227971 U published May 11, 2015 to Jinan Institute of Products China Coop, and titled "Portable Precooling Apparatus", discloses a movable pre-cooling device with both forced ventilation and differential pressure ventilation.

SUMMARY

It is an object of the present technology to provide improved method and system for controlling air flow for cooling a server rack. As such, it will be apparent to those skilled in the art that the present technology aims at controlling the air flow for cooling a server rack in a more efficient manner, thus improving energy consumption and decreasing computational burden on the controlling systems.

In developing the present technology, developers noted that there is an increased presence of free cooling data centers, where ambient cool air is drawn into the cold chamber for cooling the servers without the need to additionally cool the ambient air.

Developers also noted that not all servers stored in a server rack within a data center generate the same amount of heat and pressure. Indeed, certain servers are so computationally exhaustive that the cool ambient air in the free cooling data center is insufficient to mitigate the build up of heat and pressure within these servers.

Without wishing to be bound to any specific theory, embodiments of the present technology have been developed based on the assumption that it would be beneficial to provide a cooling device that can be controlled to selectively (i.e. on demand) cool the air intake of particular server racks requiring additional cooling within a free cooling data center. Thus, some embodiments of the present technology may provide a more economic and resource efficient manner of preventing over heating of the servers in a data center.

According to a first broad aspect of the present technology, there is disclosed a device for cooling a server rack configured for operating in a free cooling server room, the server room having a first chamber and a second chamber air-flow partitioned therebetween by the server rack and being in fluid communication therebetween via the server rack, the device comprising: a main chilling unit; a heat exchanging unit operatively coupled to the main chilling unit via a pipe running a liquid coolant; the main chilling unit including a housing for housing: an evaporator configured to cause the liquid coolant to absorb heat from air surrounding the evaporator, thereby cooling the air surrounding the evaporator; a first airlock device configured to removably secure the main chilling unit to the server rack from a side of the first chamber; a first fan configured to force air from the first chamber to the second chamber via the server rack through a first path of travel including the evaporator and the first airlock device; the heat exchanging unit including a housing for housing: a condenser in fluid communication with the evaporator via the pipe, the condenser being configured to transmit heat from the liquid coolant to air surrounding the condenser, thereby heating the air surrounding the condenser; a second airlock device configured to removably secure the heat exchanging unit to the second chamber; a second fan configured to blow the heated air into the second chamber through a second path of travel including the condenser and the second airlock device.

In some non-limiting embodiments of the device, the first chamber is a cold chamber and the second chamber is hot chamber.

In some non-limiting embodiments of the device, the server rack includes an inlet to intake cooled air from the main chilling unit; the main chilling unit further including a first inlet and a first outlet, wherein the evaporator is fluidly coupled between the first inlet and the first outlet; and wherein the first airlock device is configured to secure the first outlet to the inlet of the server rack.

In some non-limiting embodiments of the device, the first fan is fluidly coupled between the first inlet and the first outlet and fluidly upstream of the evaporator, the first fan being configured to flow the cooled air toward the server rack via the first outlet and the inlet.

In some non-limiting embodiments of the device, the main chilling unit further comprising a controller operatively coupled to at least one of the evaporator and the first fan, the controller including a processor configured to selectively: generate a first control signal to adjust a rate at which the liquid coolant absorbs heat from air surrounding the evaporator; and generate a second control signal to adjust a speed of the first fan.

In some non-limiting embodiments of the device, the controller is operatively coupled to a thermometer configured to measure a temperature of the cold chamber, and wherein the processor is configured to generate one of the first control signal and the second control signal in response to the measured temperature being above a predetermined temperature threshold.

In some non-limiting embodiments of the device, the controller is operatively coupled to a thermometer configured to measure a temperature within the server rack, and wherein the processor is configured to generate one of the first control signal and the second control signal in response to the measured temperature being above a predetermined temperature threshold.

In some non-limiting embodiments of the device, the controller is operatively coupled to a differential pressure gauge configured to measure a differential air pressure value of the cold chamber relative to the hot chamber, and wherein the processor is configured to generate the second control signal in response to the measured differential air pressure value being above a predetermined air pressure value threshold.

In some non-limiting embodiments of the device, the hot chamber includes an inlet to intake heated air from the heat exchanging unit; the heat exchanging unit further including a second inlet and a second outlet, wherein the condenser is fluidly coupled between the second inlet and the second outlet; and wherein the second airlock device is configured to secure the second outlet to the inlet of the second chamber.

In some non-limiting embodiments of the device, the second fan is fluidly coupled between the second inlet and the second outlet and fluidly upstream of the condenser, the second fan being configured to flow air heated by the condenser toward the hot chamber via the second outlet and the inlet of the second chamber.

In some non-limiting embodiments of the device, at least one of the first airlock device and the second airlock device is a rubber seal.

In some non-limiting embodiments of the device, the heat exchanging unit further comprising a compressor and an expansion valve in fluid communication with the evaporator and the condenser via the pipe.

In some non-limiting embodiments of the device, the pipe is configured to run the liquid coolant between the evaporator, the compressor, the expansion valve and the condenser in a closed loop.

In some non-limiting embodiments of the device, the liquid coolant is implemented as one of: Cholorofluorocarbon (CFC) refrigerant, Hydrochlorofluorocarbon (HCFC) refrigerant, Hydrofluorocarbon (HFC) refrigerant, and Carbon dioxide ($CO_2$).

In accordance with another broad aspect of the present technology, there is disclosed a device for cooling a server rack, the device comprising: a main chilling unit; a heat exchanging unit operatively coupled to the main chilling unit via a pipe running a liquid coolant; the main chilling unit including a housing for housing: an evaporator configured to cause the liquid coolant to absorb heat from air surrounding the evaporator at different rates; an airlock device configured to removably secure the main chilling unit to the server rack; a fan configured to force air through the server rack via a path of travel including the evaporator and the airlock device; a controller operatively coupled to at least one of the evaporator and the fan, the controller including a processor configured to selectively: generate a first control signal to adjust the rate at which the liquid coolant absorbs heat from air surrounding the evaporator; and generate a second control signal to adjust the speed of the fan; the heat exchanging unit including a housing for housing: a condenser in fluid communication with the evaporator via the pipe, the condenser being configured to transmit heat from the liquid coolant to air surrounding the condenser, thereby heating the air surrounding the condenser.

In some non-limiting embodiments of the device, the controller is operatively coupled to a thermometer configured to measure a temperature within the server rack, and wherein the processor is configured to generate one of the first control signal and the second control signal in response to the measured temperature being above a predetermined temperature threshold.

In some non-limiting embodiments of the device, the controller is operatively coupled to a differential pressure gauge configured to measure a differential air pressure value of the cold chamber relative to the hot chamber, and wherein the processor is configured to generate the second control signal in response to the measured differential air pressure value being above a predetermined air pressure value threshold.

In some non-limiting embodiments of the device, the server rack includes an inlet to intake cooled air from the main chilling unit; the main chilling unit further including a first inlet and a first outlet, wherein the evaporator is fluidly coupled between the first inlet and the first outlet; and wherein the airlock device is configured to secure the first outlet to the inlet of the server rack.

In some non-limiting embodiments of the device, the server rack is configured for operating in a free cooling server room having a cold chamber and a hot chamber partitioned by the server rack.

In some non-limiting embodiments of the device, the heat exchanging unit is provided within one of the hot chamber and an outside of the server room

DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
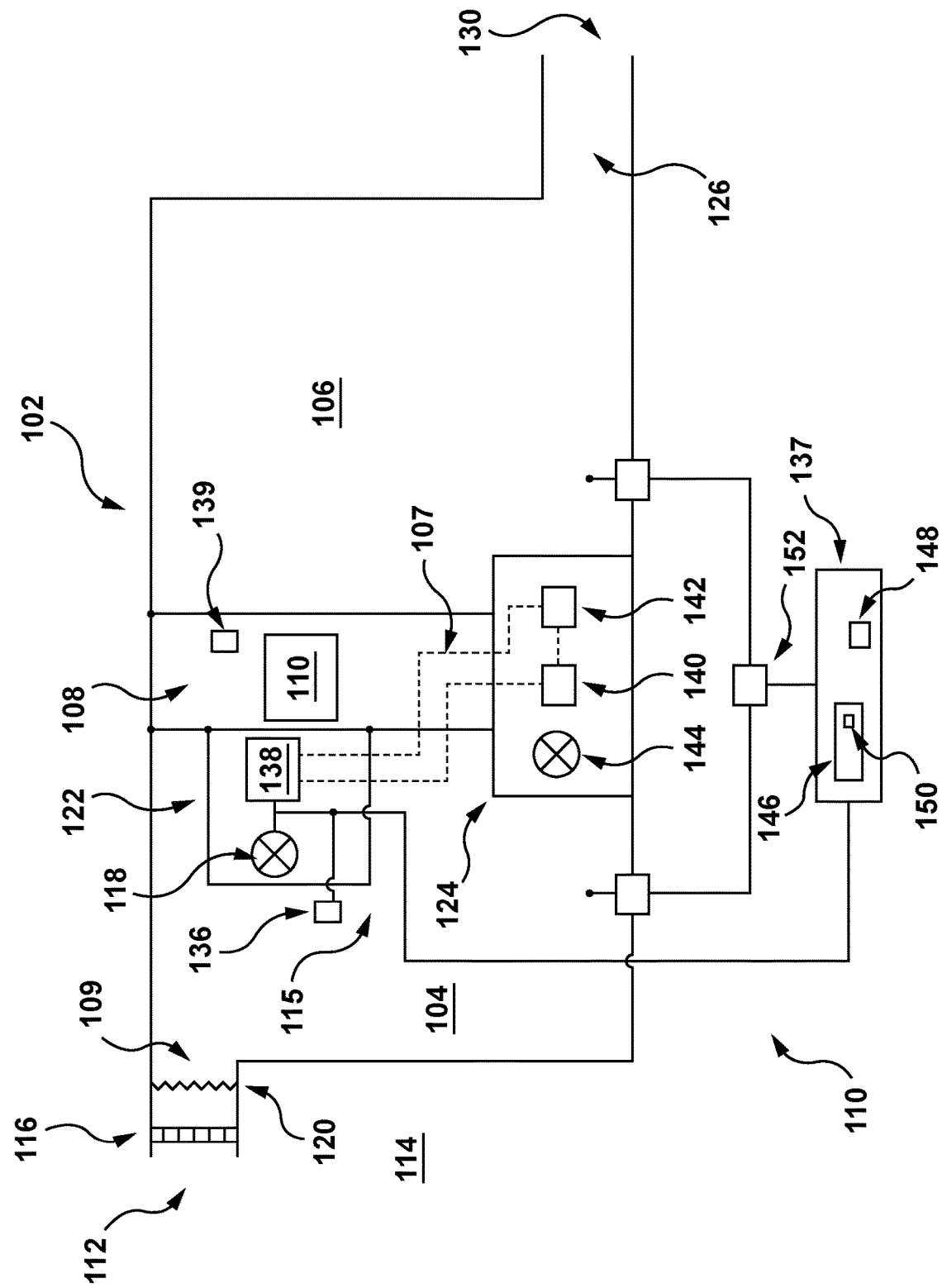
FIG. 1 is a schematic diagram depicting a system according to some non-limiting embodiments of the present technology.

Referring to FIG. 1, there is shown a schematic diagram of a system 100, the system 100 being suitable for implementing non-limiting embodiments of the present technology. It is to be expressly understood that the system 100 is depicted merely as an illustrative implementation of the present technology. Thus, the description thereof that follows is intended to be only a description of illustrative examples of the present technology. This description is not intended to define the scope or set forth the bounds of the present technology. In some cases, what are believed to be helpful examples of modifications to the system 100 may also be set forth below. This is done merely as an aid to understanding, and, again, not to define the scope or set forth the bounds of the present technology. These modifications are not an exhaustive list, and as a person skilled in the art would understand, other modifications are likely possible. Further, where this has not been done (i.e. where no examples of modifications have been set forth), it should not be interpreted that no modifications are possible and/or that what is described is the sole manner of implementing that element of the present technology. As a person skilled in the art would understand, this is likely not the case. In addition, it is to be understood that the system 100 may provide in certain instances simple implementations of the present technology, and that where such is the case they have been presented in this manner as an aid to understanding. As persons skilled in the art would understand, various implementations of the present technology may be of a greater complexity.

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope. Furthermore, as an aid to understanding, the following description may describe relatively simplified implementations of the present technology. As persons skilled in the art would understand, various implementations of the present technology may be of greater complexity.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudocode, and the like represent various processes which may be substantially represented in computer-readable media and so executed by a computer or processor, whether or not such computer or processor is explicitly shown.

The functions of the various elements shown in the figures, including any functional block labeled as a "processor" may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some non-limiting embodiments of the present technology, the processor may be a general purpose processor, such as a central processing unit (CPU) or a processor dedicated to a specific purpose, such as a graphics processing unit (GPU). Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

With these fundamentals in place, we will now consider some non-limiting examples to illustrate various implementations of aspects of the present technology.

The system 100 is configured to control the air flow for cooling a server room 102, of a data center (not depicted) or the like. The server room 102 is partitioned by a server rack 108 into a cold chamber 104 (which can also be thought of as a "first chamber"), and a hot chamber 106 (which can also be thought as a "second chamber"). The server rack 108 is configured to house one or more servers 110. The manner in which the one or more servers 110 are housed within the server rack 108 is not limited, and may for example be in a "chassis" configuration. Although in the illustrated embodiment only one server rack 108 is shown, it is not limitative. As such, it is contemplated that the server room 102 can be partitioned, by a plurality of server racks organized in rows or back-to-back, into the cold chamber 104 and the hot chamber 106.

As has been alluded above, each of the servers 110 housed within the server rack 108 generally comprises a fan (not depicted), which is configured to draw cool air from the cold chamber 104 through an inlet of the server, allow it to circulate within the servers 110 and exhaust the heated air into the hot chamber 106. Thus, heat generated within the one or more servers 110 is cooled by the cold air sucked thereinto, and the one or more servers 110 can operate normally.

In some non-limiting embodiments, the server rack 108 may include one or more large "rack fans" located behind the servers (not shown) within the server rack 108. These "rack fans" are also configured to draw cool air from the cold chamber 104 into the plurality of servers (not shown) and exhaust the heated air into the hot chamber 106.

The system 100 includes a first channel 109 coupling an air inlet 112 of the cold chamber 104 to an ambient outside 114, thereby allowing the air from the ambient outside 114 to flow into the cold chamber 104. In some non-limiting embodiments, the server room 102 is housed within a building (such as a hangar and the like) (not depicted), and the ambient outside 114 is an area outside the server room 102. As such, the ambient outside 114 may refer to, for example, the area surrounding the building, or the area surrounding the server room 102 within the building.

The amount of air from the ambient outside 114 flowing into the cold chamber 104 is controlled by a damper 116 that can be installed near one end of the first channel 109, which is configured to adjust, by a degree of opening thereof, an amount of air that flows into the first channel 109. Needless to say, other means of controlling the amount of air from the ambient outside 114 is contemplated, such as for example, an inlet fan (not shown) near the end of the first channel 109.

In some non-limiting embodiments, there can be provided a filter 120 within the first channel 109, which filter 120 prevents dust (or other impurities) carried by the air in the ambient outside 114 from entering the cold chamber 104. Needless to say, although in the depicted non-limiting embodiment of the present technology, the filter 120 is shown to be placed fluidly downstream from the damper 116, it is not limited as such, and may be placed fluidly upstream from the damper 116.

The hot chamber 106 comprises, and is in fluid communication with, a second channel 126. There is provided an air outlet 130 at the end of the second channel 126 which is open to the ambient outside 114 for exhausting the heated air within the hot chamber 106. In some non-limiting embodiments, it is contemplated that an outlet fan (not shown) is installed nearby the air outlet to force-flow the heated air from the hot chamber 106 to the ambient outside 114.

In accordance with the non-limiting embodiments of the present technology, there is provided a cooling device 115. The cooling device 115 is made up of two units, namely a main chilling unit 122 and a heat exchanging unit 124.

The main chilling unit 122 may be removably connected to an inlet (not depicted) of the server rack 108. In some non-limiting embodiments of the present technology, the main chilling unit comprises one or more fans 118 configured to control the amount of air flowing into the server rack 108. The manner in which the fans 118 are implemented is not limited. By way of example, the fans 118 may be implemented as an axial-flow fan, a centrifugal fan, or a cross-flow fan, and the like or a combination thereof. In some non-limiting embodiments of the present technology, the fans 118 are configured to increase and/or decrease the flow of air into the server rack 108 by, for example, increasing or decreasing the speed of rotation (discussed in detail below).

In some non-limiting embodiments of the present technology, the temperature of the cold chamber 104 is captured by a first thermometer 136. In some non-limiting embodiments of the present technology, the first thermometer 136 is placed in proximity to an inlet of the main chilling unit 122, to obtain a relatively-more precise temperature value of the air entering the server rack 108.

In some non-limiting embodiments of the present technology, a second thermometer 139 may be placed within the server rack 108 to obtain a relatively-more precise temperature value within the server rack 108, and/or the servers 110.

In some non-limiting embodiments of the present technology, the main chilling unit 122 further includes an evaporator 138. How the evaporator 138 is implemented is generally known in the art, and will not be described in detail herein. Suffice it to say that the evaporator 138 is configured to cool the air with the use of a coolant (described below, not shown).

The evaporator 138 is in fluid communication with a condenser 140 installed within the heat exchanging unit 124 via flexible tubes 107 (shown in broken lines). In other words, the main chilling unit 122 and the heat exchanging unit 124 are in fluid communication with each other via the flexible tubes 107. Generally speaking, the condenser 140 is configured to change the phase of the gaseous coolant into its liquid form before sending it back to the evaporator 138.

In some non-limiting embodiments of the present technology, the heat exchanging unit 124 further comprises a compressor 142 configured to control the flow of the coolant within the flexible tubes 107.

In some non-limiting embodiments of the present technology, an inlet (not shown) of the heat exchanging unit 124 faces the cold chamber 104, and the outlet (not shown) of the heat exchanging unit 124 faces the hot chamber 106. In other words, air from the cold chamber 104 is configured to flow into the hot chamber 106 via the heat exchanging unit 124.

When flowing through the heat exchanging unit 124, the air gets warmer due to the heat released by the condenser 140. In some non-limiting embodiments of the present technology, the heat exchanging unit 124 may include one or more fans 144. How the fans 144 are implemented is not limited and may for example be implemented similar to the fans 118. Although the fans 144 are depicted as being installed upstream the condenser 140, it is not limited as such. It is contemplated that the fans 144 be installed downstream the condenser, or nearby the outlet of the heat exchanging unit 124.

In at least some non-limiting embodiments of the present technology, the system 100 may further comprise a differential pressure gauge 152 configured to measure a differential pressure value corresponding to a difference of air pressure of the cold chamber 104 relative to the air pressure of the hot chamber 106.

The manner in which the differential pressure gauge 152 is implemented is known and therefore will not be described at length herein. Suffice it to say that the differential pressure gauge 152 has a first and second inlet ports (not numbered) that are each connected to a respective pressure point being monitored. For example, the first inlet port may be connected to a first pressure point within the cold chamber 104 and the second inlet port may be connected, for example, to a second pressure point within the hot chamber 106, or vice-versa. In a specific non-limiting example, the differential pressure gauge 152 can be implemented as one of the differential pressure gauges manufactured by Dwyer Instruments Inc. of Michigan, USA, under model designation DH Digihelic®.

The system 100 further comprises a controller unit 137 for controlling the air flow for cooling the server rack 108. In some non-limiting embodiments of the present technology, the controller unit 137 is a computer configured to receive and transmit signals from various devices of the system 100 (described in more detail below).

The controller unit 137 comprises a memory 146 which includes one or more storage media and generally provides a place to store computer-executable program instructions executable by a processor 148. By way of example, the memory 146 may be implemented as tangible computer-readable storage medium including Read-Only Memory (ROM) and/or Random-Access Memory (RAM). The memory 146 may also include one or more fixed storage devices in the form of, by way of example, hard disk drives (HDDs), solid-state drives (SSDs) and flash memory cards.

Controlling the air flow for cooling the server room 102 is executed by an application 150 stored within the memory 146. As described in more detail below, the application 150 comprises a set of computer executable program instructions executable by the processor 148.

Figure 2:
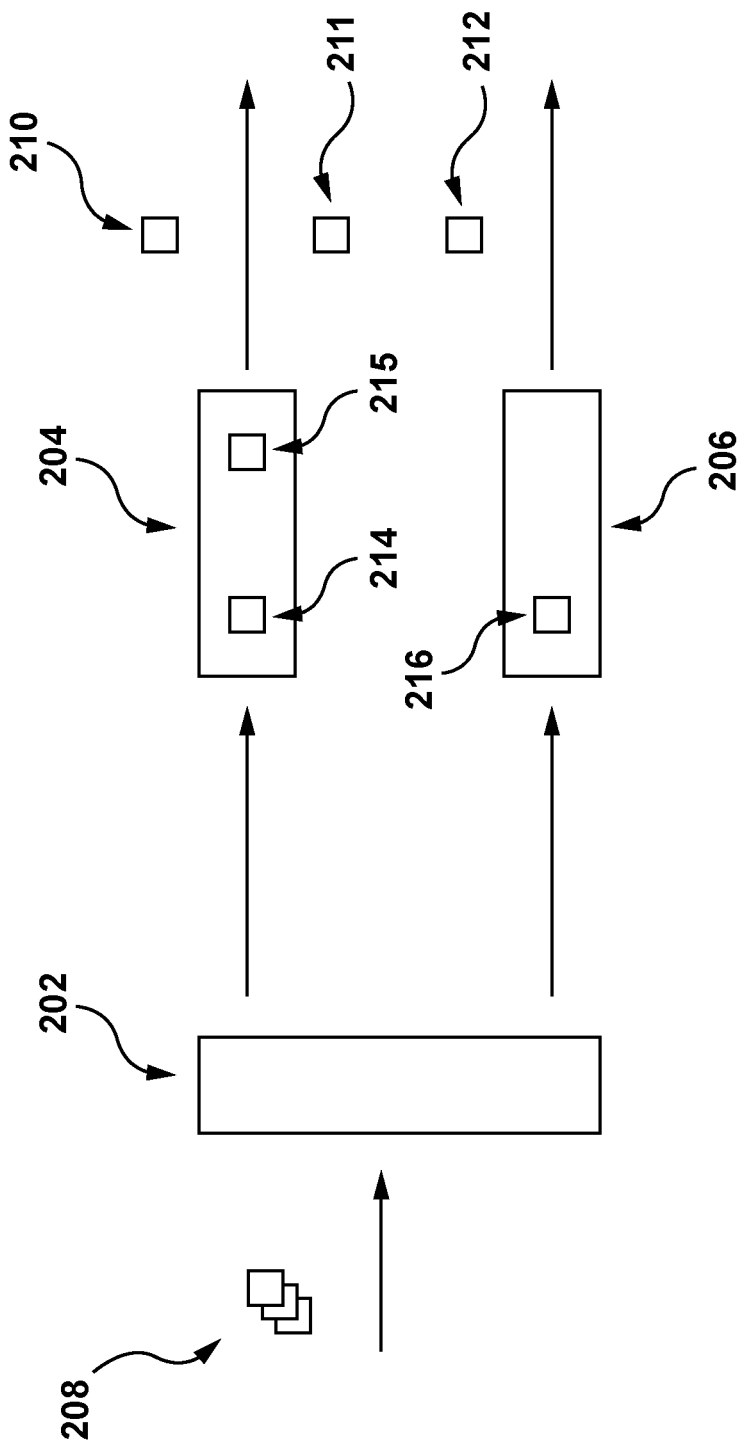
FIG. 2 depicts an example of a process of generating a first, second and third control signals by a controller unit of the system of FIG. 1.

Functions and operations of the various components of the application 150 will now be described in greater details. With reference to FIG. 2, there is depicted a schematic illustration of an operation of the application 150 for controlling the air flow between the cold chamber 104 and the hot chamber 106. The application 150 executes (or otherwise has access to): a measurement value acquisition routine 202, a fan control routine 204, and an evaporator control routine 206.

In the context of the present specification, the term "routine" refers to a subset of the computer executable program instructions of the application 150 that is executable by the processor 148 to perform the functions explained below. For the avoidance of any doubt, it should be expressly understood that the measurement value acquisition routine 202, the fan control routine 204, and the evaporator control routine 206 are illustrated schematically herein in a separate and distributed manner for ease of explanation of the processes executed by the application 150. It is contemplated that some or all of the measurement value acquisition routine 202, the fan control routine 204, and the evaporator control routine 206 may be implemented as one or more combined routines.

Functionalities of each one of the measurement value acquisition routine 202, the fan control routine 204, and the evaporator control routine 206, as well as data and/or information processed or stored therein are described below.

Receiving the Data

Each of the first thermometer 136, the second thermometer 139 and the differential pressure gauge 152 transmit sensed data to the controller unit 137 by virtue of data packets 208 transmitted to the controller unit 137. Needless to say, it is contemplated that the system 100 includes only one of, or a combination of two of, the first thermometer 136, the second thermometer 139 and the differential pressure gauge 152, and as such, the sensed data received via the data packets 208 comprise the sensed data associated with said one, or combination of two.

The data packets 208 include a respective data packet for each of the monitored measurements, and thus include a respective data packet comprising a temperature value sensed by the first thermometer 136 and the second thermometer 139, and at least one data packet comprising the differential pressure value sensed by the first differential pressure gauge 152.

Although the differential pressure gauge 152 has been depicted as hardware within FIG. 1, it is to be understood that it is not limited as such. Indeed, it is contemplated that the differential pressure gauge 152 may be implemented as a software routine that is part of the measurement value acquisition routine 202 and configured to receive, via the data packets 208, the measured air pressures from their respective first and second pressure points (implemented as pressure gauges), and calculate the differential pressure value. In a specific non-limiting example, the pressure gauges are implemented as a pressure gauge manufactured by Dwyer Instruments Inc. of Michigan, USA, under model designation DPG-200.

Controlling the Fan Speed

Based on data contained in the data packets 208 received by the measurement value acquisition routine 202, the fan control routine 204 generates a first control signal 210 for controlling the rotation speed of the fans 144 and/or fans 118.

The manner in which the first control signal 210 is generated will now be explained in more detail. In some non-limiting embodiments of the present technology, the fan control routine 204 executes a first proportional-integral-derivative (PID) algorithm 214. The first PID algorithm 214 is configured to compare the differential pressure value (determined by the differential pressure gauge 152) to a first target value (described below). The fan control routine 204 generates and transmits the first control signal 210 which contains instructions for adjusting the rotation speed of the fans 144 and/or fans 118 in order to achieve the first target value.

In some non-limiting embodiments of the present technology, the first target value is indicative of the target differential pressure value to be maintained within the cold chamber 104 in relation to the hot chamber 106. As such, it is contemplated that the controller unit 137 comprises, or is electrically coupled to, an input device (not shown) for receiving the first target value from a user (such as, for example, an operator of the system 100).

In some non-limiting embodiments of the present technology, the first target value is 0 Pa (meaning there should be, as a target, equilibrium between the pressure in the cold chamber 104 and the hot chamber 106). Needless to say, it is further contemplated that the first target value may be a different value.

In some non-limiting embodiments, if it is determined that the differential pressure value is below the first target value (for example, the differential pressure value is indicative of −5 Pa, meaning that the pressure of the cold chamber 104 is below the pressure of the hot chamber 106), the first control signal 210 contains instructions to decrease the rotation speed of the fans 144 and/or fans 118 in order to decrease the amount of heated air entering the hot chamber 106, thereby increasing the air pressure within the cold chamber 104 to achieve the first target value.

Alternatively, in some non-limiting embodiments, if it is determined that the differential pressure value is above the first target value (for example, the differential pressure value is indicative of 5 Pa, meaning that the pressure of the cold chamber 104 is above the pressure of the hot chamber 106), the first control signal 210 contains instructions to increase the rotation speed of the fans 144 and/or fans 118 to increase the amount of heated air entering the hot chamber 106, thereby increasing the air pressure within the hot chamber 106 to achieve the first target value.

In some non-limiting embodiments, if it is determined that the differential pressure value matches the first target value, the fan control routine 204 does not generate the first control signal 210. Alternatively, the fan control routine 204 may also be configured to generate the first control signal 210 which contains instructions to maintain the rotation speed of the fans 144 and/or fans 118, upon determining that the differential pressure value matches the first target value.

In some non-limiting embodiments of the present technology, the fan control routine 204 is configured to generate a second control signal 211 for controlling the rotation speed of the fans 118.

More precisely, in some non-limiting embodiments, the fan control routine 204 comprises a second PID algorithm 215 configured to compare a first temperature value received by the first thermometer 136 and/or a second temperature value received by the second thermometer 139 against second target value. The fan control routine 204 generates and transmits the second control signal 211 which contains instructions for adjusting the rotation speed of the fans 118 in order to achieve the second target value.

In some non-limiting embodiments of the present technology, the second target value is indicative of a target temperature to be maintained within the cold chamber 104 or in the server rack 108.

In some non-limiting embodiments, if it is determined that the first temperature value and/or the second temperature value is above the second target value, the second control signal 211 contains instructions to increase the rotation speed of the fans 118 in order to increase the amount of air entering the hot chamber 106, thereby decreasing the temperature within the cold chamber 104 and/or the server rack 108 to achieve the second target value.

Alternatively, in some non-limiting embodiments, if it is determined that the first temperature value and/or the second temperature value is below the second target value, the second control signal 211 contains instructions to decrease the rotation speed of the fans 118 in order to decrease the amount of air entering the hot chamber 106, thereby increasing the temperature within the cold chamber 104 and/or the server rack 108 to achieve the second target value.

In some non-limiting embodiments, if it is determined that the first temperature value and/or the second temperature value matches the second target value, the fan control routine 204 does not generate the second control signal 211. Alternatively, the fan control routine 204 may also be configured to generate the second control signal 211 which contains instructions to maintain the rotation speed of the fans 118, upon determining that the first temperature value and/or the second temperature value matches the second target value.

In some non-limiting embodiments of the present technology, the fan control routine 204 generates the first control signal 210 independently from the second control signal 211. In other words, it is contemplated that the fan control routine 204 independently controls operation of the fans 118 and fans 144. For example, the fan control routine 204 is configured to determine (i) the difference between the differential pressure value to the first target value to selectively adjust the speed of the fans 144, and (ii) the difference between the first temperature value and/or the second temperature value to the second target value to selectively adjust the speed of the fans 118.

Controlling the Temperature

Based on data contained in the data packets 208 received by the measurement value acquisition routine 202, the evaporator control routine 206 generates a third control signal 212 for adjusting a rate at which the air within the cold chamber 104 is cooled by the evaporator 138.

The manner in which the third control signal 212 is generated will now be explained. In some non-limiting embodiments, the evaporator control routine 206 comprises a third PID algorithm 216. The third PID algorithm 216 is configured to compare the second temperature value sensed by the second thermometer 139 to a temperature target value. The evaporator control routine 206 generates and transmits the third control signal 212 which contains instructions for adjusting the rate at which the air within the main chilling unit 122 is cooled by the evaporator 138.

In some non-limiting embodiments of the present technology, the temperature target value is indicative of a target temperature to be maintained within the server rack 108. In some non-limiting embodiments, the temperature target value is or about 20 degree Celsius. Needless to say, it is further contemplated that the temperature target value may be a different value. It is also contemplated that the temperature target value is inputted from the user via the input device (not shown).

In some non-limiting embodiments, if it is determined that the second temperature value is above the temperature target value, the third control signal 212 contains instruction of increasing the rate at which the evaporator 138 cools the air within the main chilling unit 122, thereby cooling the air that enters server rack 108 so as to achieve the temperature target value.

Alternatively, in some non-limiting embodiments, if it is determined that the temperature value is below the temperature target value, the third control signal 212 contains instruction of decreasing the rate at which the evaporator 138 cools the air within the cold chamber 104 so as to achieve the temperature target value.

In some non-limiting embodiments of the present technology, the evaporator control routine 206 generates the third control signal 212 independently from the first control signal 210 and the second control signal 211.

Figure 3:
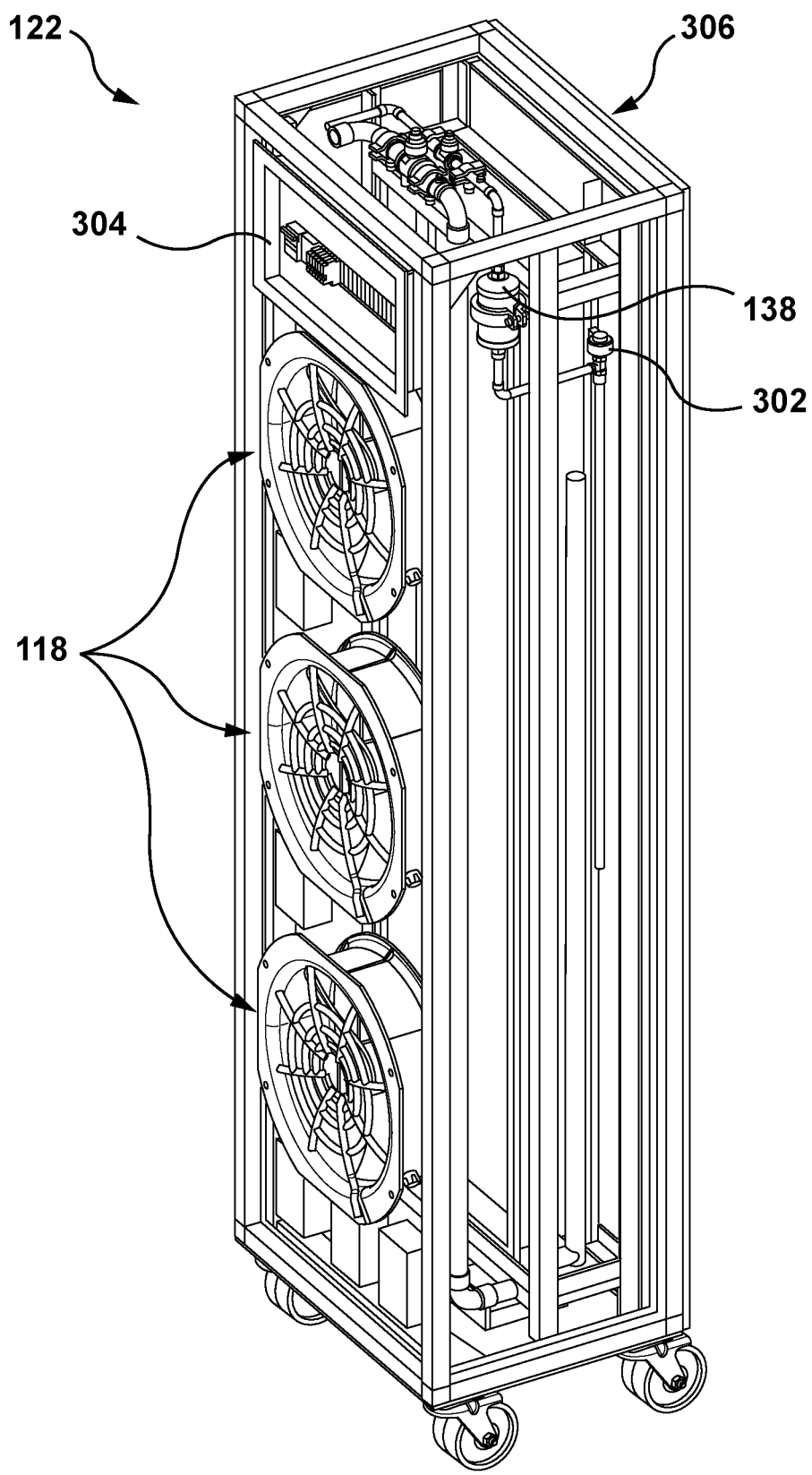
FIG. 3 is a perspective view of a main chilling unit of the system of FIG. 1.

Turning now to FIG. 3, there is depicted a perspective view of the main chilling unit 122 implemented in accordance with a non-limiting embodiment of the present technology.

In the depicted non-limiting embodiment of the present technology, the main chilling unit 122 comprises three (3) axial fans 118. In some non-limiting examples, the three axial fans 118 are implemented as fans manufactured by the Ziehl-Abegg SE of Kunzelsau, Germany, under model designation FN035-4IL.ZC.A5P5. Needless to say, although three axial fans 118 are illustrated, it is contemplated that more or less fans may be used.

The evaporator 138 is in fluid communication with an expansion valve 302 via, for example, a copper tube (not numbered). In some non-limiting examples, the evaporator 138 is implemented as an evaporator manufactured by the Ventolux. In some non-limiting example, the expansion valve 302 is implemented as an electric expansion valve manufactured by Carel Industries S.p.A. of Padova, Italy, under model designation E2V24 USF10.

The evaporator 138 further comprises a control panel 304, which is in electrical communication with the axial fans 118, the evaporator 138 and the expansion valve 302. In some non-limiting embodiments of the present technology, the controller unit 137 may establish communication with the axial fans 118, the evaporator 138 and the expansion valve 302 via the control panel 304.

In some non-limiting embodiments of the present technology, the main chilling unit 122 comprises a first airlock device 306 provided on a rear frame of the main chilling unit 122. The first airlock device 306 is configured to removably secure the main chilling unit 122 to an opening of the server rack 108. In other words, the first airlock device 306 secures the main chilling unit 122 to allow cooled air to flow into the server rack 108 without leaks. In some non-limiting embodiments of the present technology, the first airlock device 306 is a rubber seal provided on a perimeter of the rear frame.

It should be understood from the above that the main chilling unit 122 is not permanently secured to the server rack 108. Accordingly, the main chilling unit 122 may be selectively moved to be stored or to be secured to another server rack (not shown) when the server rack 108 does not require additional cooling.

Moreover, although FIG. 3 illustrates the main chilling unit 122 and its components in a configuration most susceptible for illustrating structure thereof for the purposes of this description, it should be understood that it is contemplated that walls for covering the interior of the main chilling unit 122 may be installed.

Figure 4:
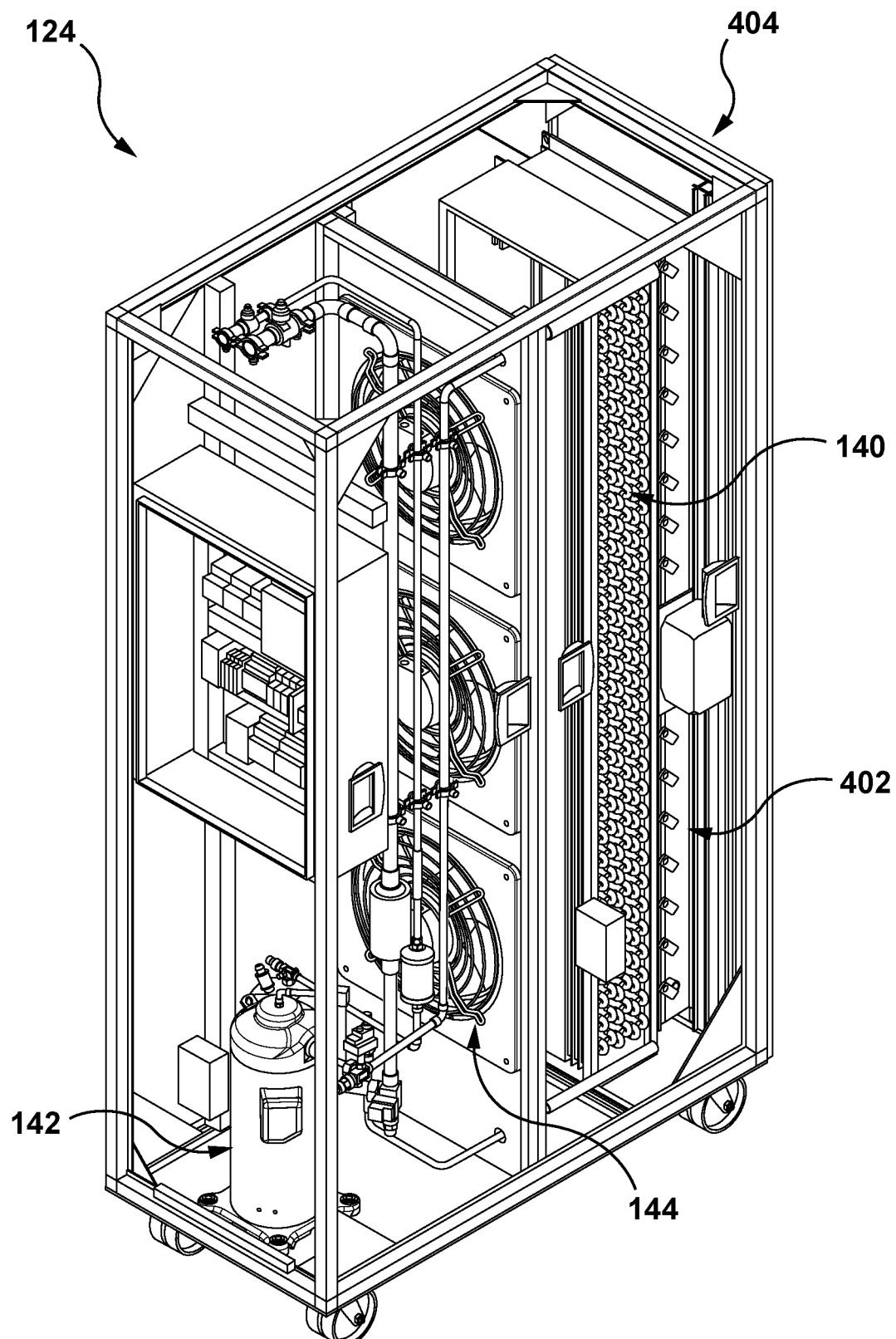
FIG. 4 is a perspective view of a heat exchanging unit of the system of FIG. 1.

Turning to FIG. 4, there is depicted a perspective view of the heat exchanging unit 124 implemented in accordance with non-limiting embodiments of the present technology.

The heat exchanging unit 124 comprises the compressor 142 in fluid communication, via a copper pipe or the like (not numbered), with the condenser 140. The heat exchanging unit 124 also comprises three (3) axial fans 144, which may be implemented as the same model as the axial fans 118.

The heat exchanging unit 124 further comprises a movable panel 402 which is configured to adjust, by a degree of opening thereof, an amount of air that flows into the hot chamber 106, via, for example, the controller unit 137. Needless to say, although the movable panel 402 is shown to be placed fluidly downstream from the condenser 140, it is not limited as such, and may be placed fluidly upstream from the movable panel 402.

In some non-limiting embodiments of the present technology, the heat exchanging unit 124 comprises a second airlock device 404 provided on a rear frame of the heat exchanging unit 124. The second airlock device 404 is configured to secure the heat exchanging unit 124 to an opening of the hot chamber 106. In other words, the second airlock device 404 secures the heat exchanging unit 124 to an inlet of the hot chamber 106 to allow heated air to flow into the hot chamber 106 without leaks. In some non-limiting embodiments of the present technology, the second airlock device 404 is a rubber seal provided on a perimeter of the rear frame.

It should be understood from the above that the heat exchanging unit 124 is not permanently secured to the inlet of the hot chamber 106. Accordingly, the heat exchanging unit 124 may be selectively moved to be stored (together with the main chilling unit 122) or to be secured to another inlet of the hot chamber 106 (not shown) when the main chilling unit 122 is coupled to another server rack (not shown).

Moreover, although FIG. 3 illustrates the heat exchanging unit 124 and its components in an uncovered configuration, it should be understood that it is contemplated that walls for covering the interior of the heat exchanging unit 124 be installed.

In some non-limiting embodiments of the present technology, the main chilling unit 122 and the heat exchanging unit 124 are in fluid communication via the flexible tubes 107 (see FIG. 1) connected to the copper piping of the main chilling unit 122 and the heat exchanging unit 124. In other words, the liquid coolant is configured to run between the evaporator 138, the expansion valve 302, the compressor 142 and the condenser 140 in a closed loop.

In some non-limiting embodiments of the present technology, the liquid coolant is implemented as one of: Chlorofluorocarbon (CFC) refrigerant, Hydrochlorofluorocarbon (HCFC) refrigerant, Hydrofluorocarbon (HCF) refrigerant, and Carbon dioxide ($CO_2$).

Moreover, although in FIG. 1, the inlet (not shown) of the heat exchanging unit 124 is illustrated as facing the cold chamber 104, and the outlet (not shown) of the heat exchanging unit 124 is illustrated as facing the hot chamber 106, it is not limited as such. Indeed, it is contemplated that the heat exchanging unit 124 be placed entirely within the hot chamber 106, or even in the ambient outside 114, while being in fluid communication with the main chilling unit 122 via the flexible tubes 107.

It should be apparent to those skilled in the art that at least some embodiments of the present technology aim to expand a range of technical solutions for addressing a particular technical problem, namely controlling the air flow within a data center having one or more server rooms, thus improving energy consumption and decreasing computation burden on the conventional controllers.

It should be expressly understood that not all technical effects mentioned herein need to be enjoyed in each and every implementation of the present technology. For example, implementations of the present technology may be implemented without the user enjoying some of these technical effects, while other implementations may be implemented with the user enjoying other technical effects or none at all.

Modifications and improvements to the above-described implementations of the present technology may become apparent to those skilled in the art. The foregoing description is indented to be exemplary rather than limiting. The scope of the present technology is therefore intended to be limited solely by the scope of the appended claims.

While the above-described implementations have been described and shown with reference to particular steps performed in a particular order, it will be understood that these steps may be combined, sub-divided, or re-ordered without departing from the teachings of the present technology. Accordingly, the order and grouping of the steps is not a limitation of the present technology.

The invention claimed is:

1. A device for cooling a server rack configured for operating in a free cooling server room, the server room having a first chamber and a second chamber air-flow partitioned therebetween by the server rack and being in fluid communication therebetween via the server rack, the device comprising:
a main chilling unit;
a heat exchanging unit operatively coupled to the main chilling unit via a pipe running a liquid coolant;
the main chilling unit including a housing for housing:
an evaporator configured to cause the liquid coolant to absorb heat from air surrounding the evaporator, thereby cooling the air surrounding the evaporator;
a first airlock device configured to removably secure the main chilling unit to the server rack from a side of the first chamber;
a first fan configured to force air from the first chamber to the second chamber via the server rack through a first path of travel including the evaporator and the first airlock device;
the heat exchanging unit including a housing for housing:
a condenser in fluid communication with the evaporator via the pipe, the condenser being configured to transmit heat from the liquid coolant to air surrounding the condenser, thereby heating the air surrounding the condenser;
a second airlock device configured to removably secure the heat exchanging unit to the second chamber;
a second fan configured to blow the heated air into the second chamber through a second path of travel including the condenser and the second airlock device.

2. The device of claim 1, wherein the first chamber is a cold chamber and the second chamber is a hot chamber.

3. The device of claim 2, wherein:
the server rack includes an inlet to intake cooled air from the main chilling unit;
the main chilling unit further including a first inlet and a first outlet, wherein the evaporator is fluidly coupled between the first inlet and the first outlet; and wherein the first airlock device is configured to secure the first outlet to the inlet of the server rack.

4. The device of claim 3, wherein the first fan is fluidly coupled between the first inlet and the first outlet and fluidly upstream of the evaporator, the first fan being configured to flow the cooled air toward the server rack via the first outlet and the inlet.

5. The device of claim 4, the main chilling unit further comprising a controller operatively coupled to at least one of the evaporator and the first fan, the controller including a processor configured to selectively:
generate a first control signal to adjust a rate at which the liquid coolant absorbs heat from air surrounding the evaporator; and generate a second control signal to adjust a speed of the first fan.

6. The device of claim 5, wherein the controller is operatively coupled to a thermometer configured to measure a temperature of the cold chamber, and wherein the processor is configured to generate one of the first control signal and the second control signal in response to the measured temperature being above a predetermined temperature threshold.

7. The device of claim 5, wherein the controller is operatively coupled to a thermometer configured to measure a temperature within the server rack, and wherein the processor is configured to generate one of the first control signal and the second control signal in response to the measured temperature being above a predetermined temperature threshold.

8. The device of claim 5, wherein the controller is operatively coupled to a differential pressure gauge configured to measure a differential air pressure value of the cold chamber relative to the hot chamber, and wherein the processor is configured to generate the second control signal in response to the measured differential air pressure value being above a predetermined air pressure value threshold.

9. The device of claim 2, wherein:
the hot chamber includes an inlet to intake heated air from the heat exchanging unit;
the heat exchanging unit further including a second inlet and a second outlet, wherein the condenser is fluidly coupled between the second inlet and the second outlet; and wherein
the second airlock device is configured to secure the second outlet to the inlet of the hot chamber.

10. The device of claim 9, wherein the second fan is fluidly coupled between the second inlet and the second outlet and fluidly upstream of the condenser, the second fan being configured to flow air heated by the condenser toward the hot chamber via the second outlet and the inlet of the second chamber.

11. The device of claim 1, wherein at least one of the first airlock device and the second airlock device is a rubber seal.

12. The device of claim 1, the heat exchanging unit further comprising a compressor and an expansion valve in fluid communication with the evaporator and the condenser via the pipe.

13. The device of claim 11, wherein the pipe is configured to run the liquid coolant between the evaporator, the compressor, the expansion valve and the condenser in a closed loop.

14. The device of claim 1, wherein the liquid coolant is implemented as one of: Cholorofluorocarbon (CFC) refrigerant, Hydrochlorofluorocarbon (HCFC) refrigerant, Hydrofluorocarbon (HFC) refrigerant, and Carbon dioxide ($CO_2$).

15. A device for cooling a server rack, the device comprising:
a main chilling unit;
a heat exchanging unit operatively coupled to the main chilling unit via a pipe running a liquid coolant;
the main chilling unit including a housing for housing:
an evaporator configured to cause the liquid coolant to absorb heat from air surrounding the evaporator at different rates;
an airlock device configured to removably secure the main chilling unit to the server rack;
a fan configured to force air through the server rack via a path of travel including the evaporator and the airlock device;
a controller operatively coupled to at least one of the evaporator and the fan, the controller including a processor configured to selectively:
generate a first control signal to adjust the rate at which the liquid coolant absorbs heat from air surrounding the evaporator; and
generate a second control signal to adjust the speed of the fan;
the heat exchanging unit including a housing for housing:
a condenser in fluid communication with the evaporator via the pipe, the condenser being configured to transmit heat from the liquid coolant to air surrounding the condenser, thereby heating the air surrounding the condenser.

16. The device of claim 15 wherein the controller is operatively coupled to a thermometer configured to measure a temperature within the server rack, and wherein the processor is configured to generate one of the first control signal and the second control signal in response to the measured temperature being above a predetermined temperature threshold.

17. The device of claim 15, wherein the server rack is configured for operating in a free cooling server room having a cold chamber and a hot chamber partitioned by the server rack; and wherein the controller is operatively coupled to a differential pressure gauge configured to measure a differential air pressure value of the cold chamber relative to the hot chamber, and wherein the processor is configured to generate the second control signal in response to the measured differential air pressure value being above a predetermined air pressure value threshold.

18. The device of claim 15, wherein:
the server rack includes an inlet to intake cooled air from the main chilling unit;
the main chilling unit further including a first inlet and a first outlet, wherein the evaporator is fluidly coupled between the first inlet and the first outlet; and wherein
the airlock device is configured to secure the first outlet to the inlet of the server rack.

19. The device of claim 17, wherein the heat exchanging unit is provided within one of the hot chamber and an outside of the server room.

* * * * *